(12) United States Patent
Chan et al.

(10) Patent No.: US 7,135,355 B2
(45) Date of Patent: Nov. 14, 2006

(54) STENCIL MASK DESIGN METHOD AND UNDER BUMP METALLURGY FOR C4 SOLDER BUMP

(75) Inventors: Chingho Philip Chan, Kowloon (CN); Guowei David Xiao, Kowloon (CN)

(73) Assignee: The Hong Kong University of Science & Technology, Clear Water Bay (HK)

( * ) Notice: Subject to any disclaimer, the term of this patent is extended or adjusted under 35 U.S.C. 154(b) by 121 days.

(21) Appl. No.: 10/859,089

(22) Filed: Jun. 3, 2004

(65) Prior Publication Data
US 2005/0014310 A1  Jan. 20, 2005

(30) Foreign Application Priority Data
Jun. 3, 2003  (CN) ............................. 03 1 42416

(51) Int. Cl.
H01L 21/44 (2006.01)
H01L 21/48 (2006.01)
H01L 21/50 (2006.01)

(52) U.S. Cl. ............................ 438/113; 438/108
(58) Field of Classification Search ........... 438/613, 438/612, 614, 26, 51, 55, 64, 106, 108
See application file for complete search history.

(56) References Cited

U.S. PATENT DOCUMENTS

| | | | | |
|---|---|---|---|---|
| 5,470,787 A | * | 11/1995 | Greer | 438/614 |
| 5,937,320 A | * | 8/1999 | Andricacos et al. | 438/614 |
| 6,107,180 A | * | 8/2000 | Munroe et al. | 438/613 |
| 6,664,176 B1 | * | 12/2003 | Hedler et al. | 438/614 |

* cited by examiner

*Primary Examiner*—David Nhu
(74) *Attorney, Agent, or Firm*—Buchanan Ingersoll PC

(57) ABSTRACT

A method for the fine-pitch stencil mask design for stencil printing bumping technology for eutectic Sn/Pb and lead-free solder material is described. In the method, a reflowing enhancement layer is introduced to improve the solder quality and reduce the pitch of solder bumps. The method of forming the layer is described as well as the forming method of matching under-bump metallurgy layer. The method of stencil mask design can match various sizes and pitch of the solder bumps. The designed mask is fixed on the stencil printer to deposit the solder materials with the required patterns. This method can increase the solder paste volume to increase the height of solder bumps after the reflowing process.

7 Claims, 6 Drawing Sheets

STENCIL MASK DESIGN METHOD AND UNDER BUMP METALLURGY FOR C4 SOLDER BUMP

CROSS-REFERENCE TO RELATED APPLICATIONS

The present invention claims priority of CN 03142416.3, filed on Jun. 3, 2003, the entire contents of which is incorporated herein by reference.

FIELD OF THE INVENTION

The present invention relates to electronic packaging, and more particularly to a fine-pitch stencil mask design method of printing solder paste and forming under bump metallization pads on a semiconductor substrate for flip chip attachment.

BACKGROUND OF THE INVENTION

In the early 1960s, the flip chip technology and controlled-collapse-chip connection (C4) technology were introduced by IBM to interconnect ICs to their substrates. A flip chip is a chip that is flipped face down and bonded to the substrate with various interconnection materials and methods such as tape-automated bonding, solder bumps, wire interconnects, isotropic and anisotropic conductive adhesives, and so on. The flip-chip solder preparation process generally composes of UBM (Under Bump Metallurgy), copper and solder bump deposition.

The solder bumping process that IBM invented is expensive and complicated because the solder material is deposited by an evaporation process through a metal mask. Most companies cannot accept the technology due to the cost. The electroplating-based flip chip bumping process can provide fine-pitch solder bumps because of the accurate pattern transfer by the photolithographic process. Although the plating bumping process is cheaper than the metal evaporation process, the facility system is more expensive than a stencil printing process. The thick photoresist process is necessary to form the plating patterns. And the metallization sputtering system is used to deposit the under-bump-metallization layers.

In the stencil printing process, an electroless plating process replaces the sputtering system to form the UBM layer. The stencil printing system can reduce the process cost because the stencil mask replaces the thick photoresist. FIGS. 1a–1c demonstrate the cross-sectional view of the stencil printing method of forming solder bumps. Firstly, the UBM layer is deposited on the pads. The solder paste material is printed on the wafer through the stencil mask with desired patterns. After the stencil mask is removed, the solder bumps form under the defined reflowing temperature profile.

However, the conventional stencil printing process cannot provide the small pitch solder bumps. During the reflowing process, the solder paste is shrunken to form as solder bumps. In order to achieve the designed bump size, the solder paste volume is 40–60% larger than the solder ball. The fine-pitch solder bumps cannot be prepared by the conventional stencil printing process. The UBM layer is critical to the reliability of solder bumps. It is necessary to improve the adhesion of the electroless plated UBM layer.

SUMMARY

In accordance with an embodiment of the present invention, a method of stencil mask designed for forming fine-pitch solder bumps and of forming under bump metallurgy layer related to stencil printing process are described and illustrated. The method and the relevant processes is available for forming various sizes of solder bumps, for example, Tin-Lead Sn—Pb alloy with various compositions, Lead-free solder (e.g., Sn—Cu, Sn—Ag, Sn—Cu—Ag, etc). A method of designing and forming a thin film is described. The thin film is called a reflowing enhancement layer in the present invention. The solder material can melt to adhere with the reflowing enhancement layer. The relationship of the stencil mask and the reflowing enhancement layer is also illustrated.

According to a first embodiment of the present invention, a design ratio value of the desired solder ball diameter to the passivation opening is from 1.1 to 1.35 on a semiconductor substrate or wafer. A metal thin film is formed on the surface of wafer. The pattern of metal thin film is designed as FIG. 2. The metal film comprises a square metal layer 2 and two rectangle metal layers 1. The layer 2 functions as a UBM layer. Both of the rectangle metal layers 1 are the reflowing enhancement layers. A design method is described with two ratio values. One is a ratio of the width (W) of the metal layer 1 to the side length (D) of the square metal layer 2 being from 0.08 to 0.15. The other is a ratio of the length (L) of the metal layer 1 to the side length (D) of the square metal layer 2 being from 0.25 to 1.2.

In accordance with an embodiment of the present invention, a method of forming both metal layer 1 and layer 2 are described as the steps: firstly, a film of a photoresist with desired patterns is prepared. A Ni—V alloy layer is deposited from 3000 ANG.(angstrom) to 15000 ANG. on the surface of the photoresist. And, then an Au layer is deposited from 300 ANG. to 800 ANG. After the photoresist is removed, both the UBM layer and the reflowing enhancement layer can be formed.

According to an embodiment of the present invention, the stencil mask design is dependent on the reflowing enhancement layer 1 and the height of solder bumps. The solder paste is deposited through the printing process on the wafer. During the reflowing process, the solder paste is molten. The solder paste may be shrunken to form a solder ball. The rectangle metal layer 1 can improve the solder ball formation because of the surface tension of the molten solder paste. The solder paste may be shrunken along to the reflowing enhancement layer. The method can eliminate the separation of solder material during the reflowing process. And it also eliminates the bridging and reduces the space between the solder balls.

BRIEF DESCRIPTION OF THE DRAWINGS

FIGS. 5a–5b illustrate the cross-sectional view of lift-off process flow, wherein FIG. 5b is a side view of perpendicular to the view of FIG. 5a.

DETAILED DESCRIPTION OF THE PREFERRED EMBODIMENT

According to the present invention, an embodiment is described using some relevant materials. The detailed processes, method and designs are illustrated according to the drawings.

Figure 3A:
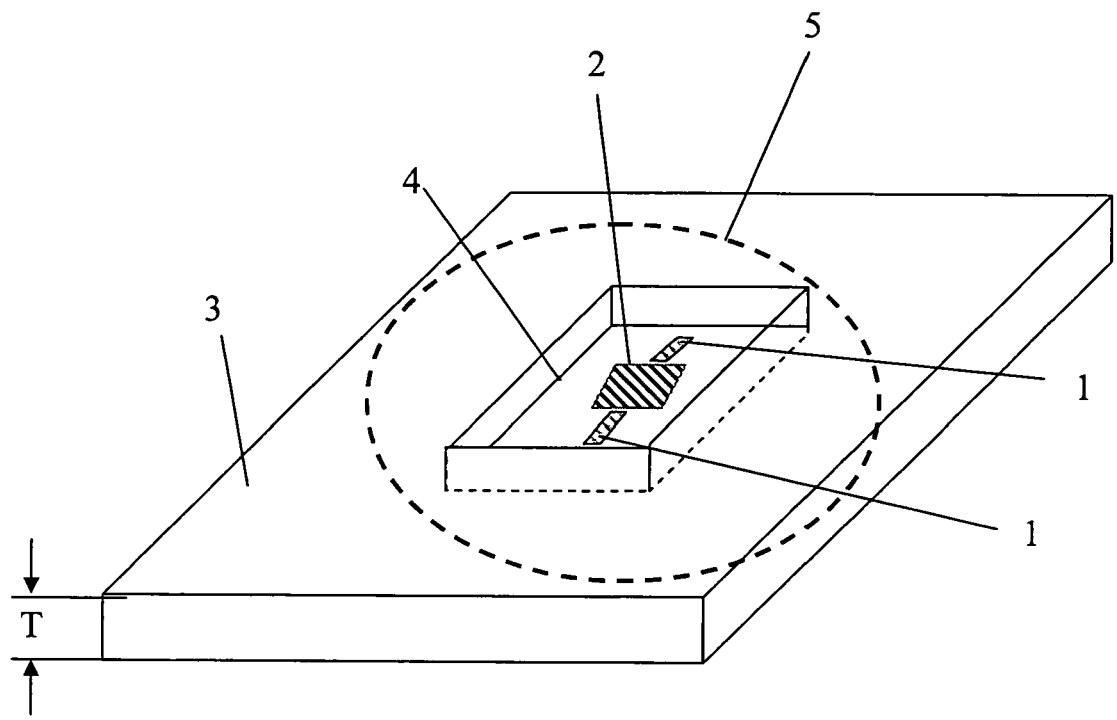
FIGS. 3a–3b demonstrate the stencil mask opening design and structure.
Figure 3B:
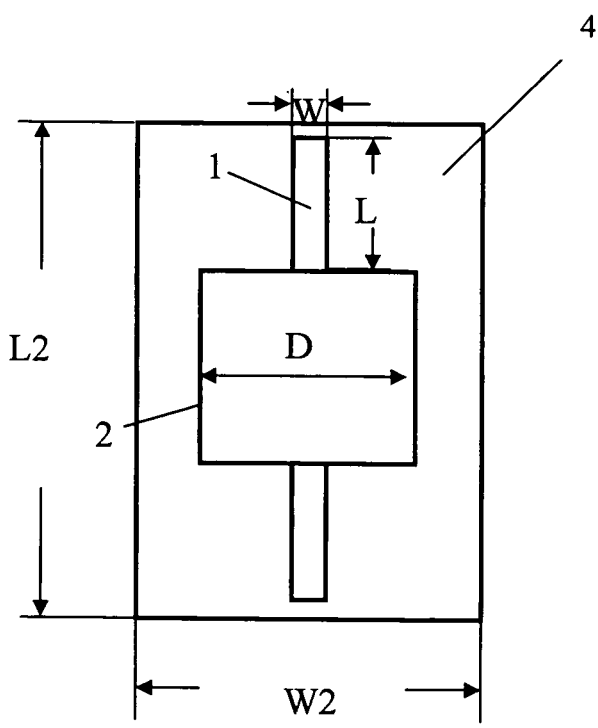

FIGS. 3a–3b illustrate the design method of stencil mask 3. The opening pattern 4 of stencil mask 3 needs to match the UBM layer 2 and the reflowing enhancement layer 1. The opening size of pattern 4 on the stencil mask 3 defines the height of solder bumps 12. An average length of the opening pattern 4 on the stencil mask 3 is defined as half of the sum of length L2 and width W2. In order to eliminate the solder paste 11 sticking up the solder mask 3, a ratio of the average length ((L2+W2)/2) of the opening pattern 4 on the stencil mask 3 to the thickness T of the stencil mask 3 is from 2.4 to 3. And the opening length L2 of the opening pattern 4 on the stencil mask 3 is a little longer than the total length (D+2L) of the UBM layer 2 and the reflowing enhancement layer 1 as shown in FIG. 3b.

Figure 4A:
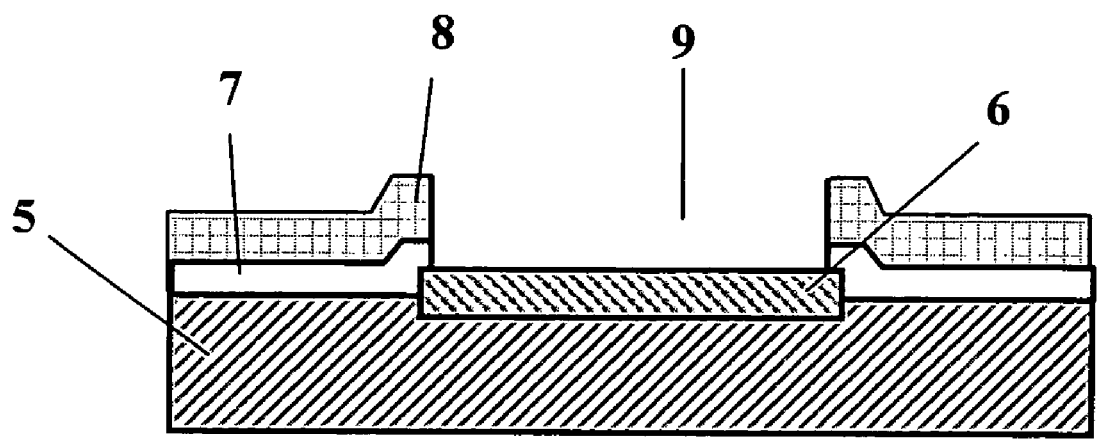
FIGS. 4a–4b illustrate the photoresist process of forming the UBM layer and the reflowing enhancement layer.
Figure 4B:
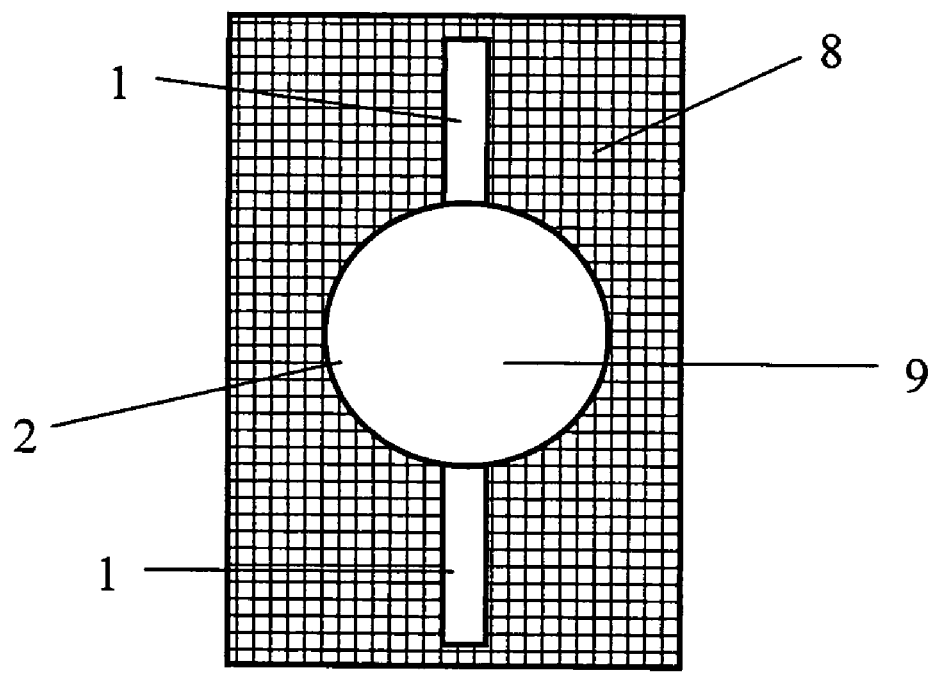

FIGS. 4a–4b and FIGS. 5a–5b illustrate the method of forming the reflowing enhancement layer 1 and the relevant UBM layer 2. Firstly, a photoresist 8 is coated and patterned through a designed photolithography mask on a wafer 5, which is already finished so as to have an interconnection metal layer 6 and a passivation layer 7 thereon. FIG. 4a demonstrates the cross-sectional view of the wafer after the photolithography process, and FIG. 4b shows the top view. An opening pattern 9 of the photoresist 8 is formed with a size a little larger than the opening size of the passivation layer 7.

Figure 1A:
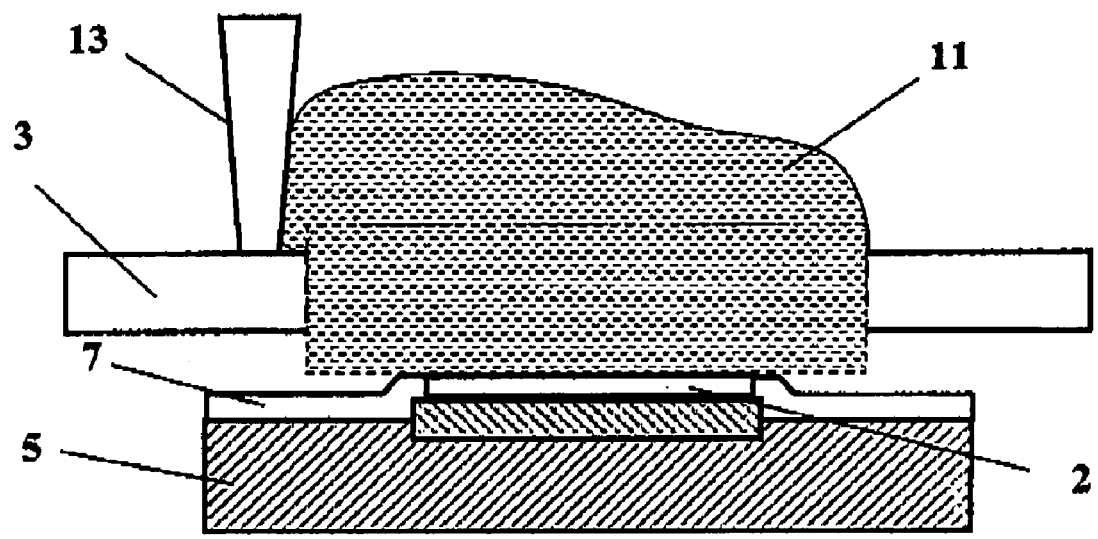
FIGS. 1a–1c illustrate the cross-sectional view of stencil printing solder bump process.
Figure 1B:
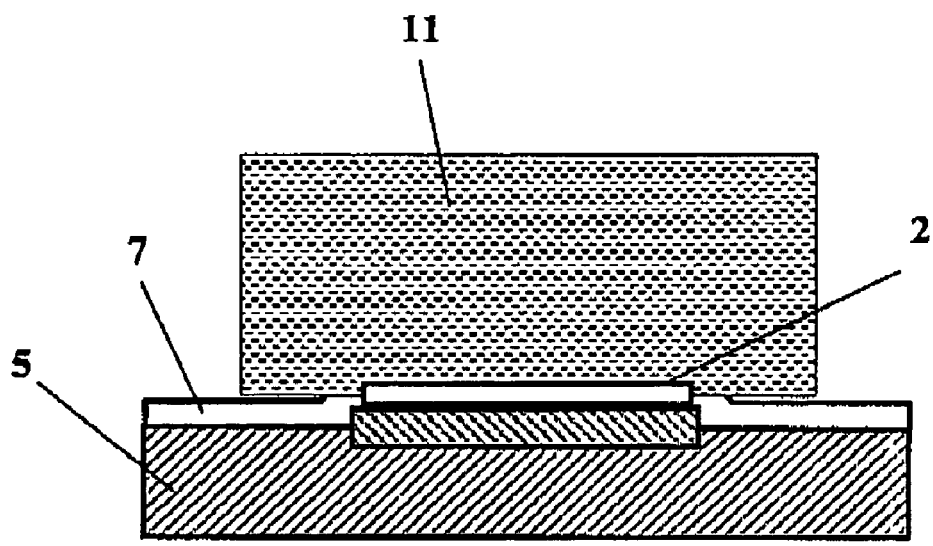
Figure 1C:
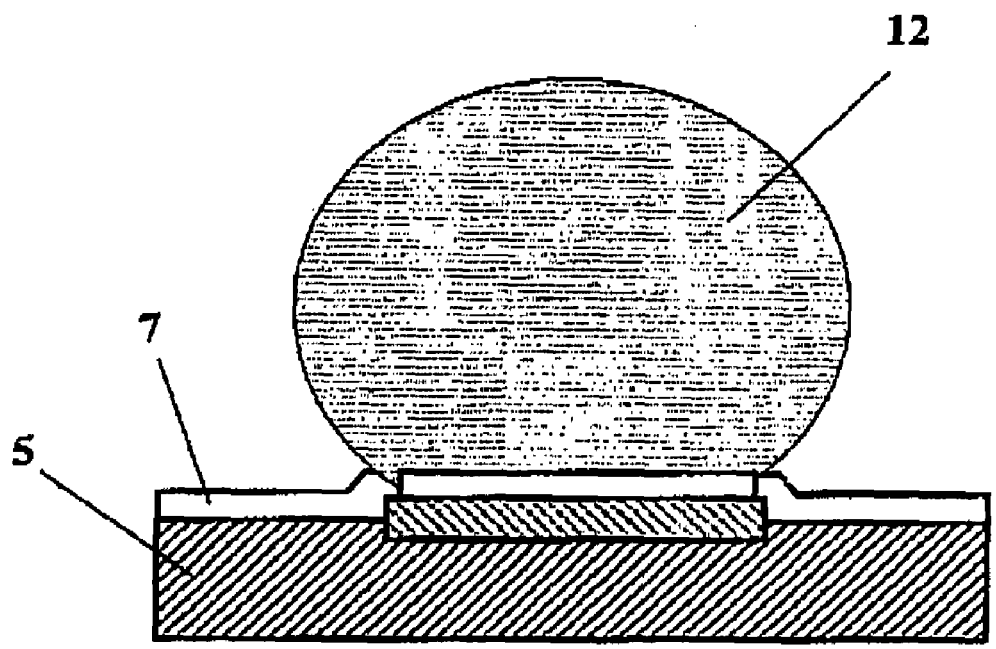
Figure 2:
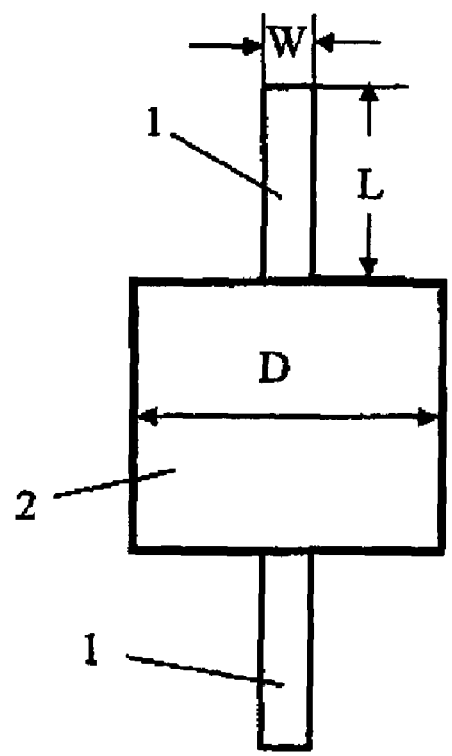
FIG. 2 illustrates the top view of the UBM layer and the reflowing enhancement layer design and structure.
Figure 5A:
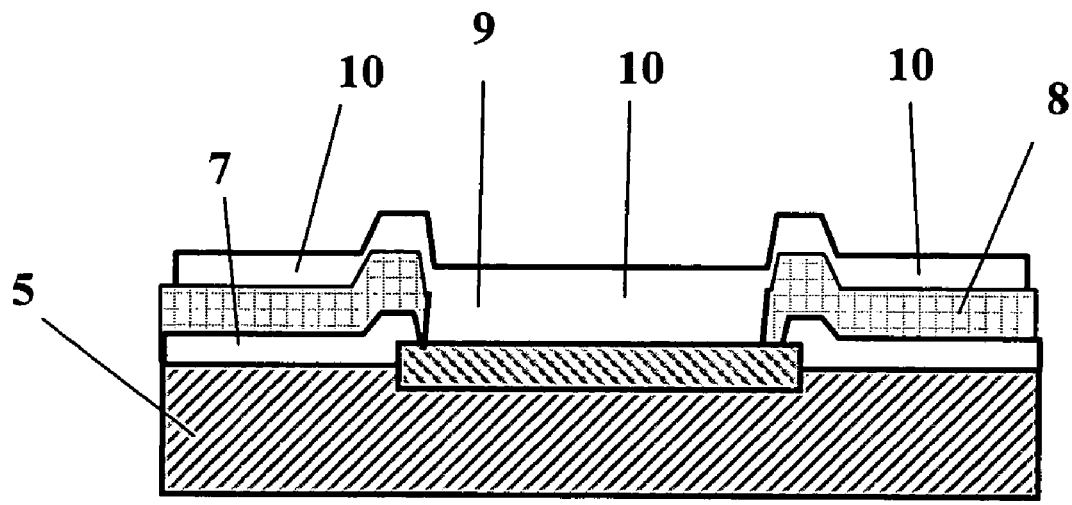
Figure 5B:
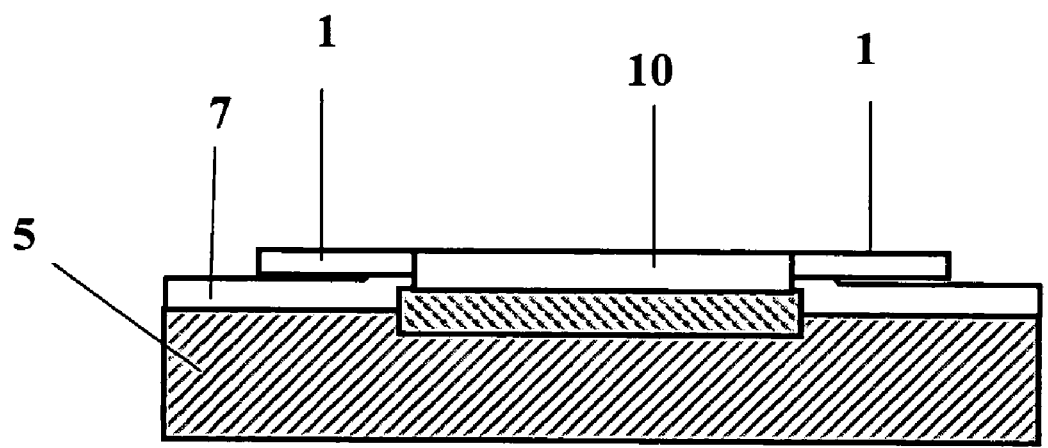

After the above photolithography process, a metal layer 10 comprised of an Ni—V alloy film and an Au film is deposited on both the surface of the photoresist 8 and the interconnection metal layer 6 by a sputtering process or an evaporation process as shown in FIG. 5a. A lift-off process is performed to remove the photoresist 8 and the portion of the metal layer 10 above the photoresist 8. The metal layer 10 left above the interconnection layer 6 comprises the UBM layer 2 and the rectangle reflowing enhancement layer 1, as shown in FIG. 5b. If the pattern of the interconnection metal layer 6 and the opening 9 of the passivation layer 7 is prepared as shown in FIG. 2, the UBM layer 2 and the reflowing enhancement layer 1 are also deposited by the electroless plating process.

Figure 6A:
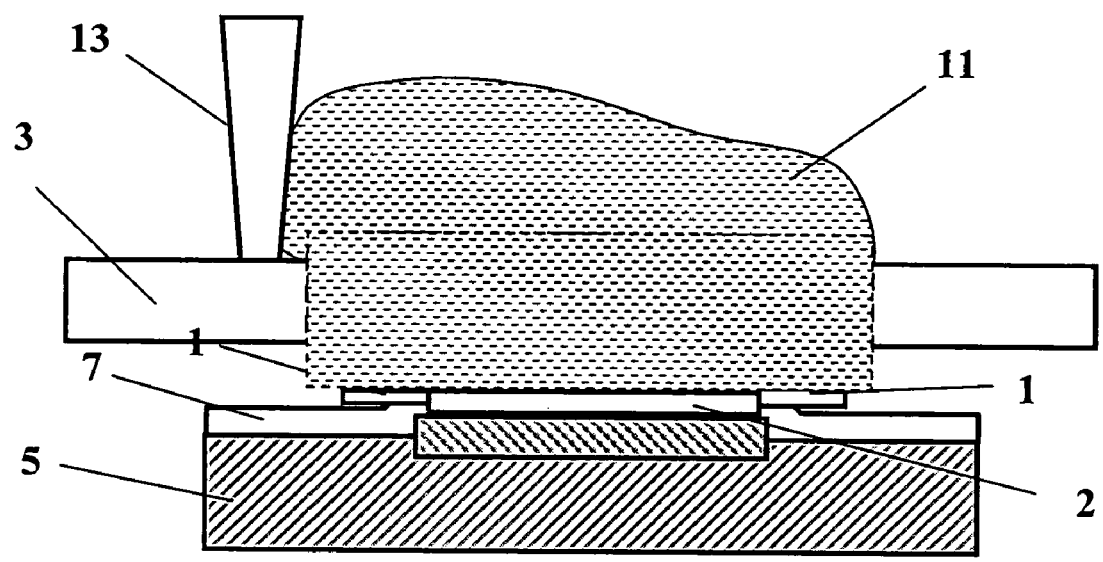
FIGS. 6a–6b illustrate the cross-sectional view of forming the solder bump through the designed stencil mask by the same view as in FIG. 5b.
Figure 6B:
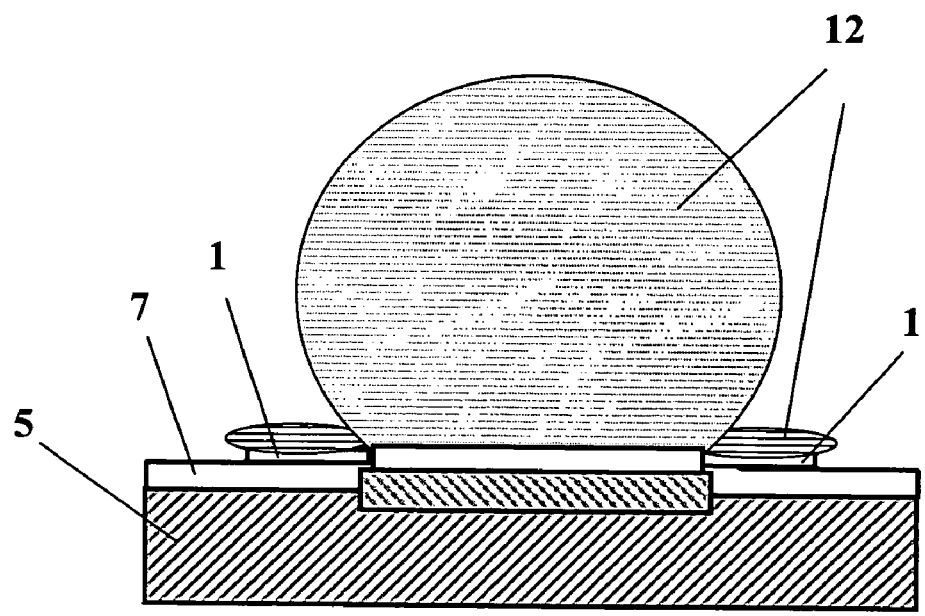

FIGS. 6a–6b illustrate the stencil printing process through the desired stencil mask 3. The stencil mask's opening pattern 4 is designed to match the UBM layer 2 and the reflowing enhancement layer 1 on the wafers. In order to achieve the fine pitch solder bumps 12, the volume of the opening pattern 4 on the stencil mask 3 is suitable for the solder bump 12 size. The volume ratio of the solder bump 12 to the stencil opening 4 is from 0.4 to 0.65. The ratio of the average length ((L2+W2)/2) of stencil opening 4 to the thickness T of stencil mask 3 is from 2.4 to 3. In the printing machine, the solder paste 11 is printed by the stencil printing squeeze 13 on the wafer 5 as shown in FIG. 6a.

The solder paste 11 is shrunken to form the solder ball 12 during the reflowing process. The reflowing enhancement layer can improve the formation of solder bump 12 because of the surface tension of molten solder material. The layer also avoids the separation of solder material during the reflowing process. The separation of solder material affects the quality and uniformity of solder bumps. And it also causes the bridging between the solder bumps.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method of forming solder bumps for a flip chip on a wafer or substrate with semiconductor devices, the method comprises:
    a) using a lift-off process, a thin metal film, comprising a central square UBM layer and two rectangular reflowing enhancement layers at the opposite sides of the central square UBM layer, is deposited with a thickness;
    b) according to a volume of a solder bump to be formed on the central square UBM layer and the reflowing enhancement layers, designing and preparing a stencil mask with an opening pattern by a design rule;
    c) placing the stencil mask on the central square UBM layer and the reflowing enhancement layers by matching the opening pattern with the UBM layer and the reflowing enhancement layers, filling soldering paste into the opening pattern of the stencil mask;
    d) removing the stencil mask; and
    e) reflowing the soldering paste to form a ball-shaped solder bump under the surface tension of the molten soldering paste with the reflowing enhancement layers.

2. The method according to claim 1, wherein said thin metal film is Ni—V alloy, Cr, Ti—W alloy, or Cr—Cu alloy.

3. The method according to claim 1, wherein said thin metal film is between 3000 to 15000 ANG. thick.

4. The method according to claim 1, wherein the design rule of the central square UBM layer and reflowing enhancement layers complies with two ratio values as follows: one is a ratio of a width of the reflowing enhancement layer to a side length of the central square UBM layer being from 0.08 to 0.15; another is a ratio of a length of the reflowing enhancement layer to the side length of the square UBM metal layer length being from 0.25 to 1.2.

5. The method according to claim 1, wherein the design rule of the opening pattern of the stencil mask complies with two ratio values as follow: one is a volume ratio of the solder bump to the opening pattern being from 0.4 to 0.65; another is a ratio of an average length of the opening pattern to a thickness of the stencil mask being from 2.4 to 3.

6. The method according to claim 1, wherein said central square UBM layer and the reflowing enhancement layers are applied by a photoresist mask during the lift-off process.

7. The method according to claim 6, wherein the photoresist mask is designed according to dimensions of the reflowing enhancement layers.

* * * * *